US009494637B2

(12) United States Patent
Hellberg et al.

(10) Patent No.: US 9,494,637 B2
(45) Date of Patent: Nov. 15, 2016

(54) METHOD FOR DETECTING ISLANDING OPERATION OF DISTRIBUTED POWER GENERATOR

(71) Applicant: ABB Oy, Helsinki (FI)

(72) Inventors: Janne Hellberg, Espoo (FI); Kimmo Heinonen, Veikkola (FI); Jari Uusimäki, Espoo (FI)

(73) Assignee: ABB Oy, Helsinki (FI)

( * ) Notice: Subject to any disclaimer, the term of this patent is extended or adjusted under 35 U.S.C. 154(b) by 467 days.

(21) Appl. No.: 14/049,751

(22) Filed: Oct. 9, 2013

(65) Prior Publication Data
US 2014/0098449 A1    Apr. 10, 2014

(30) Foreign Application Priority Data
Oct. 10, 2012   (EP) .................................... 12187942

(51) Int. Cl.
*H02J 1/00*    (2006.01)
*G01R 31/28*   (2006.01)
*H02J 3/38*    (2006.01)

(52) U.S. Cl.
CPC .............. *G01R 31/28* (2013.01); *H02J 3/381* (2013.01); *H02J 2003/388* (2013.01)

(58) Field of Classification Search
CPC  G01R 31/025;  G01R 33/385;  G01R 33/098; G01R 33/3815;  G01R 33/383;  G01R 33/4818;  G01R 31/04;  G01R 31/3675; G01R 33/34092;  G01R 33/3614;  G01R 33/543;  G01R 33/5608;  G01R 33/5611; G01R 1/06705

USPC ..................................................... 324/765.01
See application file for complete search history.

(56) References Cited

U.S. PATENT DOCUMENTS 4,621,198 A  *  11/1986  Roberge ................... H02J 3/06
                                                        307/82
6,219,623 B1     4/2001  Wills
(Continued)

FOREIGN PATENT DOCUMENTS

CN       101257209 A      9/2008
CN       101268218 A      9/2008
(Continued)

OTHER PUBLICATIONS

Search Report mailed on Apr. 8, 2013, by the European Patent Office for Application No. 12187942.3.
(Continued)

*Primary Examiner* — Jared Fureman
*Assistant Examiner* — Esayas Yeshaw
(74) *Attorney, Agent, or Firm* — Taft Stettinius & Hollister LLP

(57) ABSTRACT

A method and an arrangement are disclosed for detecting islanding operation of a distributed power generator. The method can include determining a frequency of a grid to which the distributed power generator is connected, measuring a rate of change of the frequency of the grid at an output of the distributed power generator, determining a threshold value for an alteration speed, comparing the rate of change of the frequency of the grid with the threshold value, and detecting islanding operation when the measured rate of change of the frequency exceeds the threshold value for a certain time period.

14 Claims, 1 Drawing Sheet

(56) References Cited

U.S. PATENT DOCUMENTS

| | | | |
|---|---|---|---|
| 7,840,313 B2* | 11/2010 | Horio | H02J 3/38 307/86 |
| 9,077,208 B2* | 7/2015 | Bickel | H02J 3/24 |
| 2001/0040446 A1* | 11/2001 | Lapinksi | G01R 15/142 324/126 |
| 2001/0056330 A1 | 12/2001 | Wills | |
| 2002/0195879 A1* | 12/2002 | Okui | H02J 9/062 307/64 |
| 2003/0213246 A1* | 11/2003 | Coll | F01K 17/02 60/653 |
| 2008/0204044 A1 | 8/2008 | Ponnaluri | |
| 2009/0319093 A1 | 12/2009 | Joos et al. | |
| 2010/0286838 A1 | 11/2010 | Guzman-Casillas et al. | |
| 2011/0156408 A1* | 6/2011 | Bennauer | F01K 13/02 290/40 B |
| 2011/0184571 A1* | 7/2011 | Oi | G05B 5/01 700/287 |
| 2012/0035775 A1* | 2/2012 | Garcia | F03D 7/0284 700/287 |
| 2013/0257054 A1* | 10/2013 | Ouellet | F01D 15/10 290/52 |

FOREIGN PATENT DOCUMENTS

| | | |
|---|---|---|
| CN | 101651337 A | 2/2010 |
| CN | 101794988 A | 8/2010 |
| CN | 102590663 A | 7/2012 |
| CN | 102680858 A | 9/2012 |
| EP | 1 764 894 A1 | 3/2007 |
| WO | WO 99/27629 A1 | 6/1999 |

OTHER PUBLICATIONS

Office Action issued on Oct. 16, 2015, by the State Intellectual Property Office of the People's Republic of China in corresponding Chinese Patent Application No. 201310467252.0, and an English Translation of the Office Action. (17 pages).

* cited by examiner

METHOD FOR DETECTING ISLANDING OPERATION OF DISTRIBUTED POWER GENERATOR

RELATED APPLICATION(S)

This application claims priority under 35 U.S.C. §119 to European Patent Application No. 12187942.3 filed in Europe on Oct. 10, 2012, the entire content of which is hereby incorporated by reference in its entirety.

FIELD

The present disclosure relates to detecting islanding operation of a distributed power generator connected to a utility grid.

BACKGROUND INFORMATION

Distributed power sources are used to feed additional active power into a utility grid close to electrical loads or to ensure standby power for critical loads when power from the grid is temporarily unavailable. Distributed power sources are connected to the utility grid or loads by power electronic switches.

When one or more distributed power sources become isolated from the rest of the power system and inadvertently continue to serve local island loads separately from the utility grid, the condition is known as a "loss of mains" or "unintentional islanding".

Upon having lost the stability provided by the utility grid, differences in active and reactive power consumed by the loads in the local island and the power generated by the distributed power source can lead to sudden drastic voltage and/or frequency changes in the local grid. These drastic voltage and/or frequency changes usually cause a distributed power source protection device to act and disconnect immediately.

If, however, the active and the reactive power of the loads in the local island matches the active and the reactive power generated by the distributed power source, no change in voltage and/or frequency can occur at all that would trigger the passive protection device of the distributed power source. Unless an active islanding detection is provided, the distributed power generator continues to operate. Even though some of the distributed power generators are designed to operate in an islanding grid, a number of potentially serious problems is associated with islanding.

Distributed power sources can become an isolated source of electricity power during loss of mains, causing harm to utility personnel and equipment.

Customer equipment can be damaged by uncontrolled voltage and/or frequency changes in the local grid.

Utility personnel or the public can be harmed by the inadvertent energizing of lines by the distributed power sources.

It is therefore desirable to be able to immediately detect an unintentional loss of mains in order to be able to disconnect the distributed power source from the network.

EP patent publication 1764894 discloses a method for detecting islanding operation of a distributed generator. The method includes the steps of introducing a reactive current reference square wave to the grid, detecting load voltage changes at every change in the reactive current reference wave, and determining whether the detected load voltage changes exceed a predetermined islanding detection threshold value, indicating a loss of mains and an islanding operation of the distributed generator. The amplitude of the reactive current reference square wave is constant.

SUMMARY

A method is disclosed of detecting islanding operation of a distributed power generator, wherein the method comprises: determining a frequency of a grid to which the distributed power generator is connected; measuring a rate of change of the frequency of the grid at an output of the distributed power generator; determining a threshold value for an alteration speed; comparing the rate of change of the frequency of the grid with the threshold value; and detecting islanding operation when the measured rate of change of the frequency exceeds the threshold value for a certain time period.

An arrangement is also disclosed for detecting islanding operation of a distributed power generator, wherein the arrangement comprises: means for determining a frequency of a grid upon connection of the grid to the distributed power generator; means for measuring a rate of change of the frequency of the grid at an output of the distributed power generator; means for determining a threshold value for an alteration speed; means for comparing the rate of change of the frequency of the grid with the threshold value; and means for detecting islanding operation when the measured rate of change of the frequency exceeds the threshold value for a certain time period.

BRIEF DESCRIPTION OF THE DRAWINGS

In the following, the disclosure will be described in greater detail by reference to of exemplary embodiments and with reference to the attached drawings, in which.

DETAILED DESCRIPTION

A reliable method and arrangement for detecting islanding operation of a distributed generator are disclosed herein.

An exemplary method according to the disclosure is based on the idea of measuring a rate of change of frequency at a distributed power generator and comparing the measured rate of change with a threshold value. When the measured frequency change rate exceeds the threshold value for a certain period of time, it is determined that the utility grid is lost and that the distributed power generator feeds power to an island network. After the above determination the distributed power generator is disconnected from the grid.

In an exemplary embodiment, the threshold value used in the method is determined during the operation of the distributed power source by measuring the rate of the frequency change when the island network is not present. This enables the threshold value to be determined accurately and the threshold to be adapted to prevailing conditions. Further, the use of such a threshold need not involve any information on the properties of the network.

An exemplary method and arrangement according to the disclosure can provide reliable detection of islanding even in a situation where the active and the reactive power consumed by the load in the isolated network correspond to the active and the reactive power produced by the distributed power generator in the isolated network.

An exemplary method according to the disclosure does not necessarily involve a separate active excitation, such as a reactive current reference, introduced into the grid in order to be able to determine whether islanding operation occurs.

The method according to the disclosure can be applied for example to a solar power plant being connected to the grid through an electric inverter. In such a case, the solar power plant forms the distributed power source.

Figure 1:
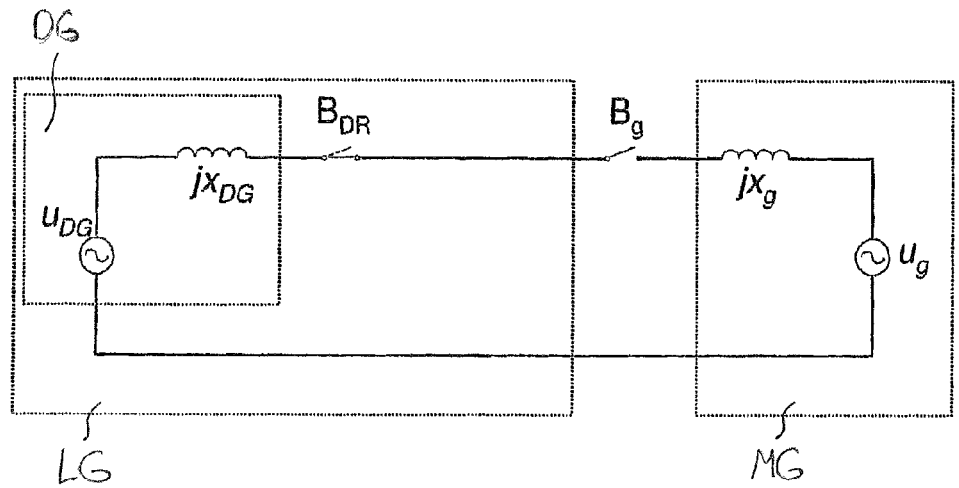
FIG. 1 shows an exemplary circuit model of a grid.

FIG. 1 shows an exemplary circuit model of a grid. When a first breaker $B_g$ connecting a local island grid LG to a main grid MG is opened, a distributed power source DG in the local island grid LG continues to supply the local island grid LG with electric power.

If the active and the reactive load of the local island grid LG are significantly different from the active and the reactive power generated by the distributed generator DG, a drastic voltage and/or frequency change occurs in the local island grid LG when the first breaker $B_g$ is opened. This drastic voltage and/or frequency change indicates a loss of the main grid MG. Distributed power source DG protection devices will act and disconnect the distributed power source DG from the local island grid LG by opening a second breaker $B_{DR}$ associated with the distributed power source DG. No further action is thus required in such a situation. FIG. 1 shows that the second breaker $B_{DR}$ is outside the distributed generator. However, the breaker can also be situated in the distributed power source and, more precisely, in a solar inverter.

If, however, the active and the reactive power of the local island grid LG match exactly the active and the reactive power produced by the distributed power source DG, no voltage and/or frequency change occurs which would trigger the protection devices, and the distributed power source DG continues to operate. The UL 1741 standard specifies that even under such conditions the distributed power source DG must be disconnected within two seconds.

A known solution to this issue is to feed an active excitation to the local island in order to be able to detect islanding on the basis of changes in the voltage or current. The disclosure does not, however, necessarily involve an active excitation which is fed to the local island. As disclosed herein, the detection of islanding can be carried out by, for example, monitoring the rate of change of frequency of the grid. A change in the rate of change of the frequency occurs when the local island grid LG becomes isolated even if the active and the reactive power of the local island grid LG match exactly the active and the reactive power produced by the distributed power source DG. This is possible because in practice the inverter control itself acts like a weak excitation signal which can be seen in the rate of change of the grid frequency. In an island network, even a small excitation signal causes a detectable change in the grid frequency.

The change in the rate of change of frequency of the grid when the local island grid LG becomes isolated might be enhanced by introducing an excitation to the local island grid LG. The excitation could be rather small since the aim is only to enhance the speed of change in the frequency, (e.g., not the change in the voltage). The amplitude of the excitation which might be fed into the local network could be for example directly proportional to the active power produced by the distributed power source DG. The introduction of the excitation into the local island grid LG would form active monitoring of the local island grid. Without the excitation the monitoring of the local island grid LG would be passive.

When the distributed power source, for example, a solar array, and the electric inverter connected to the solar array is started, the monitoring of the rate of change of frequency is started.

For determining the rate of change of frequency, the grid frequency is determined. The grid frequency is determined by, for example, measuring the phase voltages, main voltages or phase currents of the grid and by determining from the measured values the frequency of the grid. The frequency can be determined from the measurements in any known manner.

At its simplest, the frequency can be determined by detecting zero crossings of the grid voltage or current and calculating from the time differences between the zero crossings the value of the frequency. More precise methods of determining the frequency include for example using phase locked loops. It is also to be noted that the power electronic device connected to the network for feeding power from the distributed power source also needs to be synchronized with the network and thus the device, such as an inverter, also involves the frequency information.

As disclosed herein, the rate of change of the frequency can be calculated. The frequency of the grid can be continuously determined and from the determined values of the frequency the change of the frequency is determined. If the value of the frequency is updated with a time interval ts, the speed or rate of a frequency change can be calculated as the frequency change in the time interval divided by the time interval ts. The obtained value represents the time derivative of the frequency, and its unit can be given in Hz/s.

Further, according to the present disclosure, the rate of change of frequency can be compared with a threshold value. The threshold value is thus a value representing an allowable rate of change of frequency. At its simplest, the threshold value can be given in the method as a constant value. This constant value could be approximated from historical or empiric data.

According to an exemplary embodiment, the threshold value is determined based on the measured rate of change of frequency after the start of the distributed power source. When the system is started, measurement of the rate of change of frequency is also initiated. The measurements are collected, and from the measured data a value representing normal network conditions is determined. Such normal conditions refer to a situation in which the distributed power source is not feeding an island network.

In an exemplary embodiment, the threshold value is determined from the historical data representing the rate of change of frequency. An envelope curve is formed from the absolute value of the measured rate of change of frequency. This envelope curve is further multiplied by a constant value and low-pass-filtered with a filter that has a large time constant as compared with the cycle time of the utility network. Another solution is to calculate a moving average from the envelope curve. The moving average efficiently averages the obtained data such that a normal rate of change of frequency is obtained.

According to an exemplary embodiment, the island network is detected by comparing the magnitude of the rate of change of frequency with the threshold value. Thus, in the method, the formed envelope curve is compared with the threshold. Once the envelope curve exceeds the threshold for a certain time period, it is determined that an island network is formed.

The constant used in forming the threshold value can be given as a parameter to the method. The constant has a value higher than one, and the purpose of the constant is to raise the formed average of the envelope curve substantially above the envelope curve in normal operation. The constant used changes the sensitivity of the method such that when the constant is selected to be greater, the rate of change of frequency has to change more in order to exceed the threshold.

As the threshold value is calculated according to an exemplary embodiment as a moving average of the envelope curve, the threshold is self-adaptive to changing conditions. This is to say that if the trend of normal variation in the rate of change of frequency changes, the threshold value follows the trend. However, if the rate of change of frequency changes abruptly, the formed envelope curve exceeds the threshold value before the threshold value changes.

In the above, the disclosure is described by using an envelope curve. The envelope curve represents the obtained values that are used in the method. In discrete systems, the frequency is sampled at a sampling frequency, (e.g.; samples are taken at time intervals Ts). An envelope curve is formed by storing the samples and, similarly, a moving average is calculated by selecting the number of samples used in the average, and calculating the average of the selected last samples. Other averaging methods can also applied when forming the threshold value.

When the threshold value is formed, determining whether the rate of change of frequency exceeds the threshold for a certain time period can be carried out by determining whether a certain number of consecutive samples has a higher absolute value than the threshold value. Thus, a certain period of time corresponds to a certain number of samples when the sampling period is fixed. However, the method described in the disclosure need not necessarily require any fixed sampling period.

Figure 2:
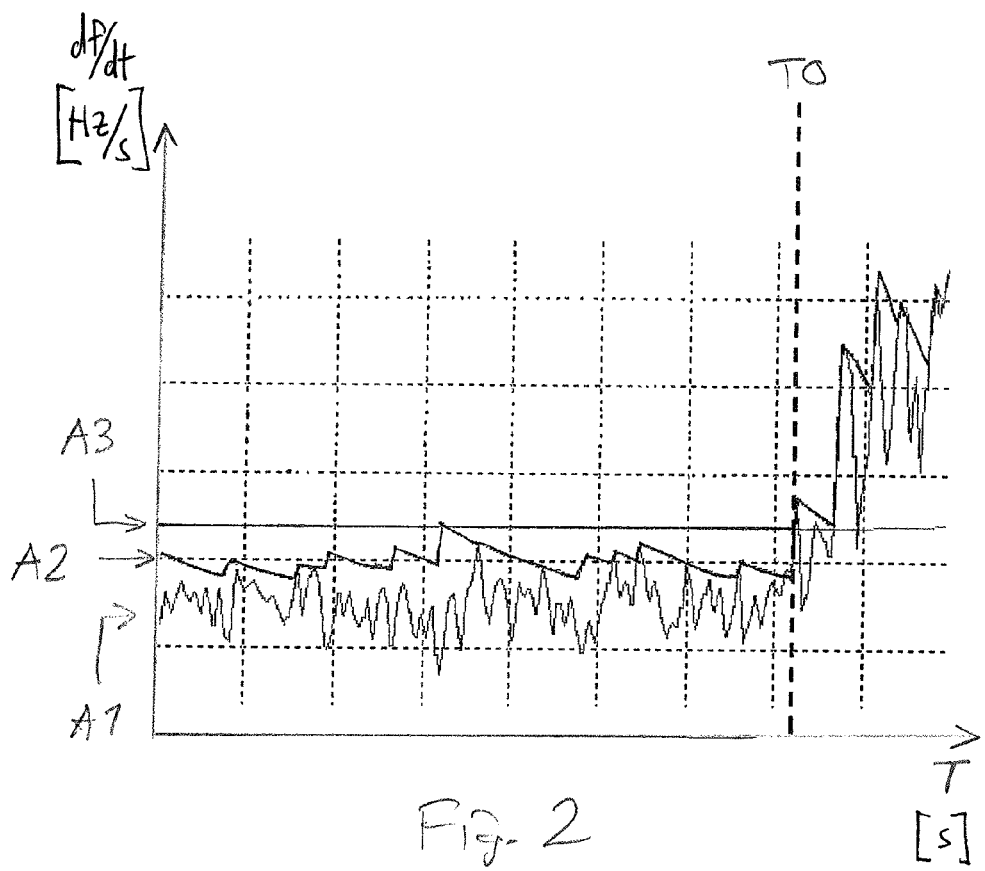
FIG. 2 shows exemplary principles disclosed herein.

FIG. 2 shows an example of waveforms during operation of an embodiment. In FIG. 2, line A1 shows a momentary rate of change of frequency as a function of time T. As can be seen, the momentary rate of change varies considerably also in normal operation. Line A2 shows the envelope curve obtained from line A1 by calculating the absolute value of the rate of change of frequency.

Further, FIG. 2 shows a low-pass-filtered curve A3 that has been multiplied by a constant for increasing the level of the curve. The curve A3 is the threshold curve which in the method is compared with the envelope curve A2.

In FIG. 2, the magnitude of the momentary rate of change of frequency, i.e. the envelope curve A2, exceeds the threshold A3 at a time instant T0. When the envelope curve A2 remains above the threshold A3 for a certain time period, it is concluded that a power source is feeding an island network. In FIG. 2, the envelope curve A2 remains above the threshold A3 after the time instant T0, and thus an island network is detected.

After the island network is detected, the distributed power source is disconnected from the island network such that the network is left with no power.

According to an exemplary embodiment, the distributed power generator produces reactive power for enhancing the detection of the formation of an island network. The reactive power is produced especially when it is desired that the islanding detection should be an active one. In such an embodiment, the reactive power from the distributed power generator can be continuously changed. The magnitude of injected reactive power can be kept at such a level that when the supplied network is in its normal state, the reactive power does not disturb the network. Once an island is formed, the injected reactive power alters the rate of change of frequency, and the islanding is detected.

The additional reference value for the reactive power is added to the prevailing reactive power reference. According to an exemplary embodiment, the amplitude of the produced reactive power is proportional to the active power produced by the distributed generator. As the amount of active power produced by a distributed generator changes, the reference for the amplitude of the reactive power is also changed. The reactive power reference can be a square wave signal or some other signal waveform that includes changes that have the desired effect on the rate of change of frequency.

An exemplary method of the disclosure can be implemented in an inverter which is a part of the distributed generator and is used for supplying power to the network. An example of such a distributed generator is a photovoltaic power producing system which is connected to the utility grid. In such a system, a photovoltaic array is connected to a power electronic device. The power electronic device is used for extracting the maximum available power from the photovoltaic array and further for modifying the voltage such that the power can be fed to the utility network. The conversion of power in the device can, for example, include boosting the voltage in one or more stages, together with controlling the voltage to a set DC level. Further, the DC voltage is finally inverted to an AC voltage that is suitable to be fed to the utility grid. The power electronic device is for example referred to as a solar inverter or a photovoltaic inverter.

Such solar inverters can include processing capacity that can be used for implementing a method as disclosed herein. Further, the solar inverters can include measurement circuits for measuring the grid voltage and the frequency of the grid. Further, the solar inverter can include disconnectors that can be used for disconnecting the distributed power generator from the grid when it is concluded that the power from the generator is fed to an isolated network. The arrangement of the disclosure can thus be implemented using a solar inverter.

It will be apparent to those skilled in the art that, as technology advances, the inventive concepts disclosed herein can be implemented in various ways. The disclosure and its embodiments are not limited to the examples described above but can vary within the scope of the claims.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A method of detecting islanding operation of a distributed power generator, wherein the method comprises:
    determining a frequency of a grid to which the distributed power generator is connected;
    measuring a rate of change of the frequency of the grid at an output of the distributed power generator;
    determining a threshold value for an alteration speed;
    comparing the rate of change of the frequency of the grid with the threshold value; and
    detecting islanding operation when the measured rate of change of the frequency exceeds the threshold value for a certain time period,
    wherein determining the threshold value for the rate of change of the frequency of the grid comprises:

forming an envelope curve from absolute values of a momentary rate of change of the frequency;
averaging the formed envelope curve; and
multiplying the averaged curve by a constant for obtaining the threshold value.

2. A method according to claim 1, wherein the averaging of the formed envelope curve comprises:
low-pass filtering the formed envelope curve.

3. A method according to claim 1, wherein the averaging of the formed envelope curve comprises:
calculating a moving average of the formed envelope curve.

4. A method according to claim 1, wherein comparing the rate of change of the frequency with the threshold value comprises:
comparing the formed envelope curve with the threshold value.

5. A method according to claim 1, comprising:
feeding reactive power by the distributed power generator to the grid, the reactive power having an amplitude that is proportional to active power produced by the distributed power generator.

6. A method according to claim 5, wherein the reactive power fed to the grid has a square wave waveform.

7. A method according to claim 5, wherein the reactive power fed to the grid has a waveform including changes that change the rate of change of frequency when an island network is formed.

8. A method according to claim 1, comprising:
disconnecting the distributed power generator from the grid when islanding operation is detected.

9. An arrangement for detecting islanding operation of a distributed power generator, wherein the arrangement comprises:
means for determining a frequency of a grid upon connection of the grid to the distributed power generator;
means for measuring a rate of change of the frequency of the grid at an output of the distributed power generator;
means for determining a threshold value for an alteration speed;
means for comparing the rate of change of the frequency of the grid with the threshold value; and
means for detecting islanding operation when the measured rate of change of the frequency exceeds the threshold value for a certain time period,
wherein determining the threshold value for the rate of change of the frequency of the grid comprises:
forming an envelope curve from absolute values of a momentary rate of change of the frequency;
averaging the formed envelope curve; and
multiplying the averaged curve by a constant for obtaining the threshold value.

10. A method according to claim 2, wherein comparing the rate of change of the frequency with the threshold value comprises:
comparing the formed envelope curve with the threshold value.

11. A method according to claim 3, wherein comparing the rate of change of the frequency with the threshold value comprises:
comparing the formed envelope curve with the threshold value.

12. A method according to claim 4, comprising:
feeding reactive power by the distributed power generator to the grid, the reactive power having an amplitude that is proportional to active power produced by the distributed power generator.

13. A method according to claim 12, comprising:
disconnecting the distributed power generator from the grid when islanding operation is detected.

14. The arrangement of claim 1, in combination with a power grid.

* * * * *